United States Patent
Kraft et al.

(10) Patent No.: US 8,884,442 B2
(45) Date of Patent: Nov. 11, 2014

(54) METHOD FOR PRODUCING A SEMICONDUCTOR COMPONENT WITH A THROUGH-CONTACT AND SEMICONDUCTOR COMPONENT WITH THROUGH-CONTACT

(75) Inventors: Jochen Kraft, Oberaich (AT); Stefan Jessenig, Graz (AT); Günther Koppitsch, Lieboch (AT); Franz Schrank, Graz (AT); Jordi Teva, Graz (AT); Bernhard Löffler, Gleisdorf (AT); Jörg Siegert, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 13/820,998

(22) PCT Filed: Aug. 9, 2011

(86) PCT No.: PCT/EP2011/063709
§ 371 (c)(1), (2), (4) Date: May 15, 2013

(87) PCT Pub. No.: WO2012/031845
PCT Pub. Date: Mar. 15, 2012

(65) Prior Publication Data
US 2013/0221539 A1     Aug. 29, 2013

(30) Foreign Application Priority Data
Sep. 10, 2010  (DE) .......................... 10 2010 045 055

(51) Int. Cl.
*H01L 21/48* (2006.01)
*H01L 23/48* (2006.01)
*H01L 21/768* (2006.01)
*H01L 21/74* (2006.01)

(52) U.S. Cl.
CPC ............ *H01L 23/481* (2013.01); *H01L 21/486* (2013.01); *H01L 21/76898* (2013.01); *H01L 21/743* (2013.01)
USPC ........... 257/774; 257/278; 257/621; 257/777; 438/637; 438/639

(58) Field of Classification Search
USPC ........... 257/278, 621, 774, 777; 438/637, 639
See application file for complete search history.

(56) References Cited

U.S. PATENT DOCUMENTS

| 5,741,733 A | 4/1998 | Bertagnolli et al. |
| 5,766,984 A | 6/1998 | Ramm et al. |
| 7,041,576 B2 * | 5/2006 | Pozder et al. ................. 438/458 |

(Continued)

FOREIGN PATENT DOCUMENTS

| DE | 4400985 C1 | 5/1995 |
| DE | 4433846 C2 | 3/1996 |

(Continued)

*Primary Examiner* — Peniel M Gumedzoe
(74) *Attorney, Agent, or Firm* — McDermott Will & Emery LLP

(57) ABSTRACT

Through the intermetal dielectric (2) and the semiconductor material of the substrate (1) a contact hole is formed, and a contact area of a connection metal plane (3) that faces the substrate is exposed in the contact hole. A metallization (11) is applied, which forms a connection contact (12) on the contact area, a through-contact (13) in the contact hole and a connection contact (20) on a contact area facing away from the substrate and/or on a vertical conductive connection (15) of the upper metal plane (24).

4 Claims, 11 Drawing Sheets

(56) References Cited

U.S. PATENT DOCUMENTS

| | | |
|---|---|---|
| 7,589,009 B1 | 9/2009 | Kar-Roy et al. |
| 2005/0087853 A1 | 4/2005 | Okumura et al. |
| 2007/0037379 A1 | 2/2007 | Enquist et al. |
| 2007/0224776 A1 | 9/2007 | Chiou |
| 2008/0179728 A1* | 7/2008 | Ikeda ............................ 257/686 |
| 2009/0302480 A1 | 12/2009 | Birner et al. |
| 2010/0123254 A1 | 5/2010 | Kraft et al. |

FOREIGN PATENT DOCUMENTS

| | | |
|---|---|---|
| DE | 102009012594 A1 | 12/2009 |
| DE | 102008033395 B3 | 2/2010 |
| DE | 102008058001 A1 | 5/2010 |
| DE | 102009004725 A1 | 7/2010 |
| WO | 2010/006916 A1 | 1/2010 |
| WO | 2010/081603 A1 | 7/2010 |
| WO | 2010/083922 A1 | 7/2010 |

* cited by examiner

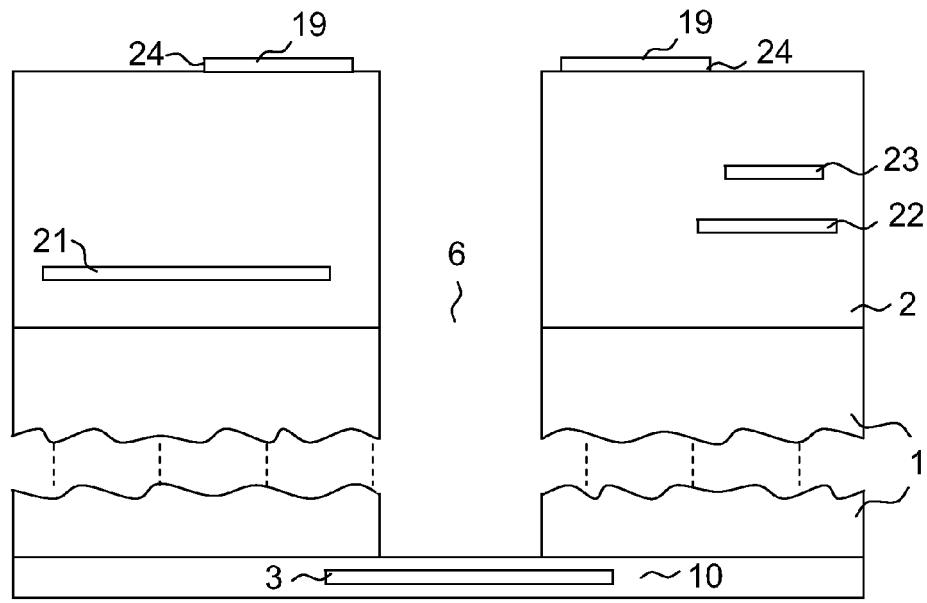
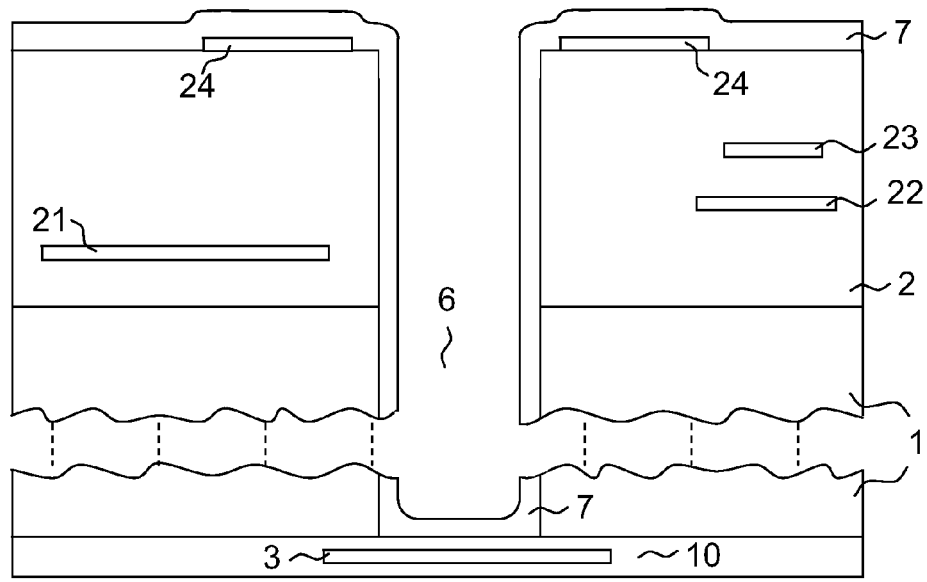

METHOD FOR PRODUCING A SEMICONDUCTOR COMPONENT WITH A THROUGH-CONTACT AND SEMICONDUCTOR COMPONENT WITH THROUGH-CONTACT

The present invention pertains to the production of semiconductor components with through-contacts through the substrate, known as through-wafer contacts, which are provided particularly for vertical electrical connections between different chips.

DE 10 2008 033395 B3 describes a method for producing a semiconductor component with a through-contact, wherein a substrate made of a semiconductor material with a buried insulation layer and with a contact pad made of electrically conductive material arranged in the insulation layer is provided. An opening reaching down to the insulation layer above the contact pad is made from an upper side of the substrate. After a dielectric has been applied, the dielectric layer and the insulation layer inside the opening are removed sufficiently so that an upper side of the contact pad is exposed. A metallization is applied in such a manner that it contacts the contact pad. A through-contact reaching up to the contact pad is made on a rear side of the substrate opposite from the opening.

A through-contact furnished with a metallization in the substrate need not be completely filled. In case of a large diameter of the contact hole, it is therefore sufficient if the metallization is present on the side wall of the contact hole. Because the remaining opening of the contact hole cannot be easily filled with a photoresist, for example, it is necessary to produce masks intended for structuring in the production process by means of an expensive process known as spray coating.

The problem of the present invention is to specify how a through-contact with a relatively large diameter can be realized in the substrate of the semiconductor element in the simplest possible manner.

This problem is solved with the method in accordance with the characteristics of claim 1 for producing a semiconductor element with a through-contact. Configurations follow from the dependent claims.

In the method for producing a semiconductor component with a through-contact, a substrate made of a semiconductor material is first furnished with an inter-metal dielectric and with a metal plane. The metal plane is arranged in the inter-metal dielectric and has a contact area facing away from the substrate, or is furnished with a vertical conductive connection leading though the inter-metal dielectric on the side facing away from the substrate. A base substrate that is furnished with a connection metal plane surrounded by an electrically insulating material and having a contact area is connected to the substrate on the side of the substrate facing away from the inter-metal dielectric so that the contact area is facing the substrate. A contact hole is formed through the inter-metal dielectric and the contact area of the connection metal plane is exposed in the contact hole.

A metallization is applied, which forms a connection contact on the contact area facing the substrate, a through-contact in the contact hole, and a connection contact on the contact area facing away from the substrate and/or directly on the vertical conductive connection.

In one embodiment of the method, the vertical conductive connection is tungsten and the metallization forms a connection contact on the vertical conductive connection. In another embodiment of the method, the metal plane that comprises the contact area facing away from the substrate is arranged in the inter-metal dielectric and the inter-metal dielectric above this contact area is removed before application of the metallization.

In another embodiment of the method, an opening is produced in the inter-metal dielectric by means of a mask that is provided with an opening in the contact hole area before production of the contact hole. The opening of the mask is enlarged or the mask is replaced by another mask with a larger opening, so that the contact area facing away from the substrate is located in the larger opening of the mask. The contact hole is produced by using the inter-metal dielectric as a hard mask, the inter-metal dielectric being partially removed in the area of the larger opening of the mask.

In another embodiment of the method, the inter-metal dielectric is removed in the larger opening of the mask to such an extent that the contact area facing away from the substrate is exposed.

In another embodiment of the method, a spacer made of electrically insulating material is produced in the contact hole before application of the metallization, so that the metallization is electrically insulated from the semiconductor material by the spacer.

In another embodiment of the method, the spacer is produced by applying the electrically insulating material and is then etched back. If desired, the inter-metal dielectric can likewise be etched back, so that the contact area facing away from the substrate is exposed.

In another embodiment of the method, tungsten is used for the metallization. An additional metal plane of a different metal is applied to the metallization and structured together with the metallization.

In the semiconductor component with a through-contact, a substrate of a semiconductor material is present. The substrate has an inter-metal dielectric and a metal plane that is arranged in the inter-metal dielectric and comprises a contact area facing away from the substrate and/or a vertical conductive connection on the side facing away from the substrate. A base substrate is connected to the substrate on the side facing away from the inter-metal dielectric and is furnished with a connection metal plane surrounded by electrically insulating material and having a contact area facing the substrate. A contact hole penetrates the inter-metal dielectric and the semiconductor material of the substrate. A metallization forms a connection contact on the contact area facing the substrate, a through-contact in the contact hole, and a connection contact on the contact area facing away from the substrate and/or directly on the vertical conductive connection.

In one embodiment of the semiconductor component, the metallization comprises tungsten and is structured outside the contact hole. Another metal plane of a different metal is arranged on the metallization and structured corresponding to the metallization.

In another embodiment of the semiconductor component, the vertical conductive connection (15) is tungsten and the metallization (11) forms a connection contact (20) on the vertical conductive connection (15).

A more complete description of examples of the method and the semiconductor components produced therewith follows, with reference to the appended figures.

FIG. 3 shows a cross-section according to FIG. 2 after the production of a contact hole.

FIG. 4 shows a cross-section according to FIG. 3 after the application of a spacer material.

Figure 1:
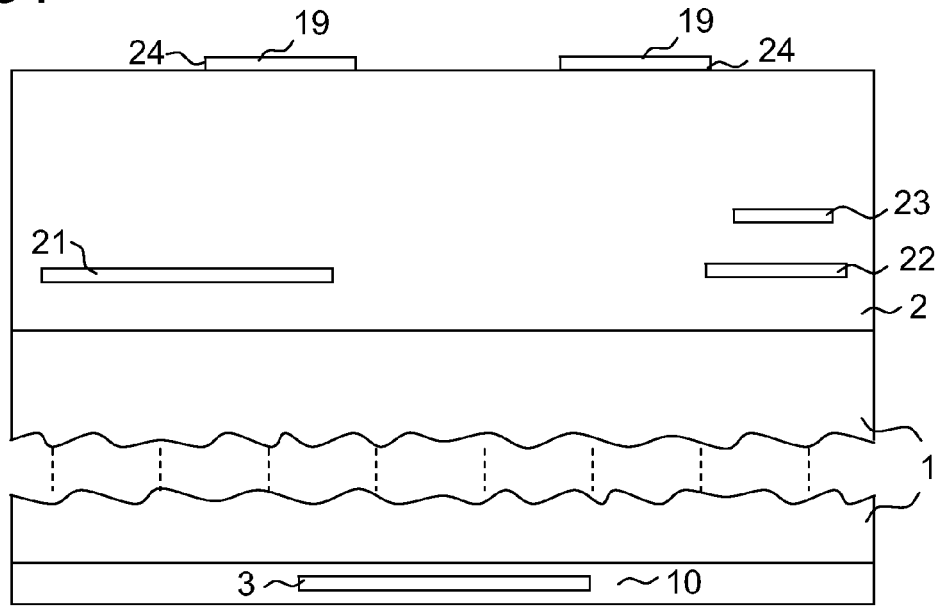
FIG. 1 shows a cross-section through an intermediate product of one variant of the production method.

In cross-section, FIG. 1 shows an arrangement of a substrate 1 of a semiconductor material on a base substrate 10, e.g. a semiconductor wafer. The substrate 1 and the base substrate 10 can be connected to one another by a bonding layer, in particular by means of a conventional wafer bonding method. The bonding layer can be an oxide of the semiconductor material for example. In the cross-section in FIG. 1, the base substrate 10 is shown as a thin layer. The illustrated layer can comprise the entire base substrate 10 or only a dielectric layer, more particularly an oxide layer, situated on a semiconductor body or wafer of the base substrate 10 and can also be provided as a bonding layer if necessary. In this case, the semiconductor body or wafer adjoins the layer of the base substrate 10 shown at the bottom in FIG. 1.

On the upper side of the substrate 1, facing away from the base substrate 10, there is an inter-metal dielectric 2 in which at least one metal plane is formed. The number of metal planes is not fixed in advance, but depends on the selected production process and possibly also on components or circuit components integrated into the substrate 1. As an example, four metal planes 21, 22, 23, 24, which can be structured as desired into conductor traces for wiring and connected to one another via vertical conductive connections, are schematically drawn in FIG. 1. A metal such as aluminum that is typically used for conductor traces can be used as the material for the metal planes 21, 22, 23, 24. In the embodiment according to FIG. 1, the fourth metal plane 24 is situated on the upper side of the inter-metal dielectric 2 as the highest metal plane. The structured portions of the metal plane 24 have upper-side contact areas 19, which face away from substrate 1. The base substrate 10 has a connection metal plane 3, which is surrounded by insulating material and is intended for a through-contact.

Figure 2:
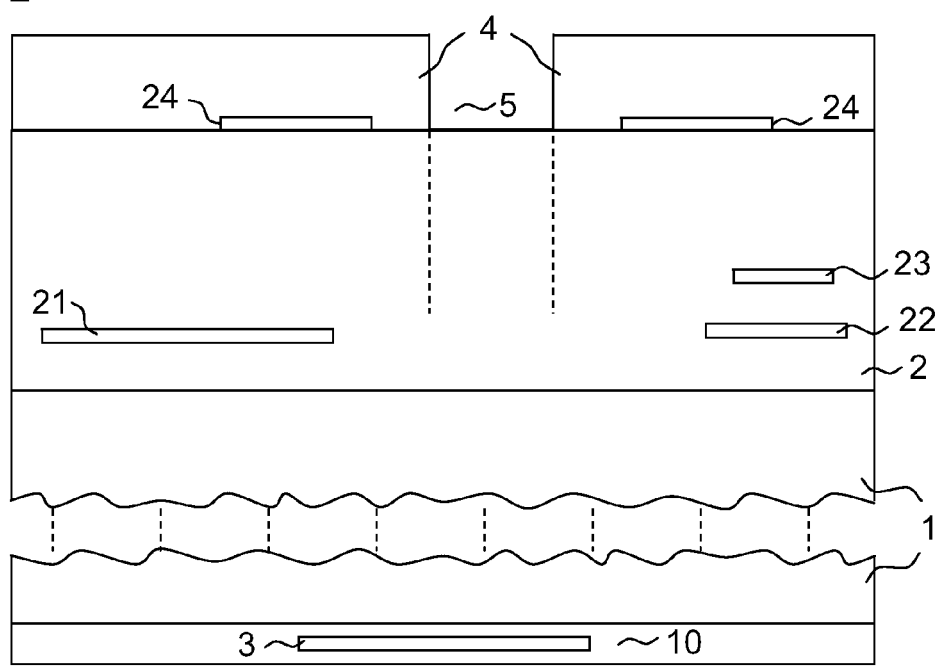
FIG. 2 shows a cross-section according to FIG. 1 after the production of a mask.

In order to produce a contact hole, a mask 4 having an opening 5 in the area of the contact hole to be produced is arranged according to FIG. 2 on the upper side of the inter-metal dialectic 2. The position of the contact hole to be produced is indicated in FIG. 2 by the vertical dashed lines. The metal planes 21, 22, 23, 24 are preferably structured in such a manner that an inter-metal dielectric 2 is not interrupted by portions of the metal planes 21, 22, 23, 24 in the area of the contact hole to be formed. A contact hole is produced by means of the mask 4 by first removing the inter-metal dielectric 2 and then the semiconductor material of the substrate 1 in the area of the opening 5 of the mask 4. The semiconductor material can be removed by means of DRIE (deep reactive ion etching) for example.

FIG. 3 shows the arrangement according to FIG. 2 after etching of the contact hole 6. The contact hole 6 extends through the inter-metal dielectric 2 and the substrate 1 to the base substrate 10. It is not necessary to expose an upper side of the connection metal plane 3 in this step of the method; instead the connection metal plane 3 can be buried in the electrically insulating material of the base substrate 10. It is expedient if a spacer, with which the semiconductor material of the substrate 1 is electrically insulated, is first formed on the side wall of the contact hole 6.

FIG. 4 shows a cross-section according to FIG. 3 after application of an electrically insulating material 7 that is provided for the spacer and applied conformally over the entire surface. This electrically insulating material 7 is then anisotropically etched back in order to form the spacer. The electrically insulating material 7 can, for example, be an oxide of the semiconductor material, especially silicon dioxide, which can be etched back with the methods generally used for that purpose.

Figure 5:
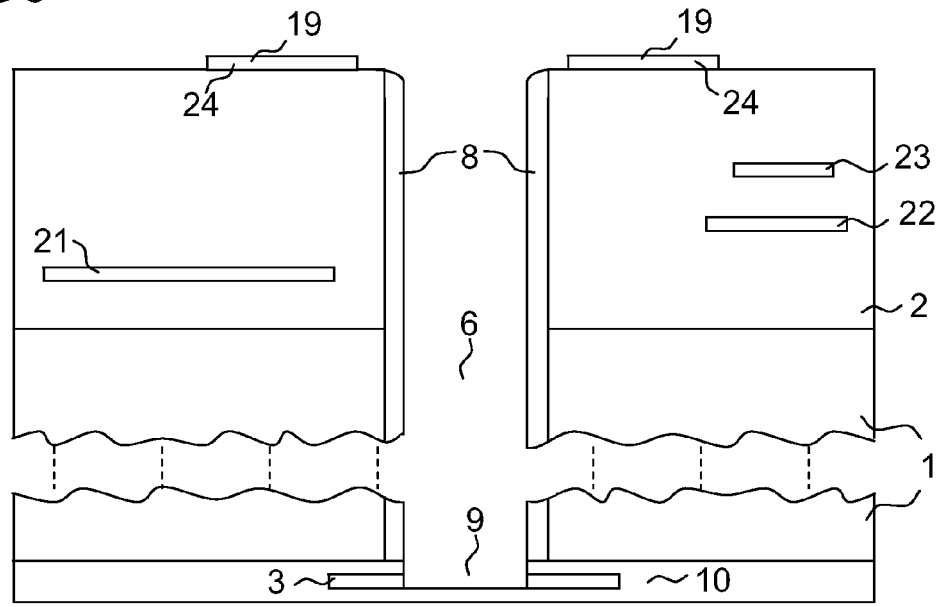
FIG. 5 shows a cross-section according to FIG. 4 after a spacer etching.

FIG. 5 shows a cross-section as in FIG. 4 after production of the spacer 8, which covers the side wall of the contact hole 6. The semiconductor material of the substrate 1 that was previously exposed in the contact hole 6 is now covered by the spacer 8, so that the semiconductor material is now insulated electrically from the interior of the contact hole 6. In the course of the spacer etching, the upper contact areas 19 facing away from the substrate 1 on the uppermost metal layer 24 and a contact area 9 on the upper side of the connection metal plane 3 of the base substrate 10 facing the substrate 1 were exposed. The contact areas 9, 19 are to be connected to one another by means of a through-contact.

Figure 6:
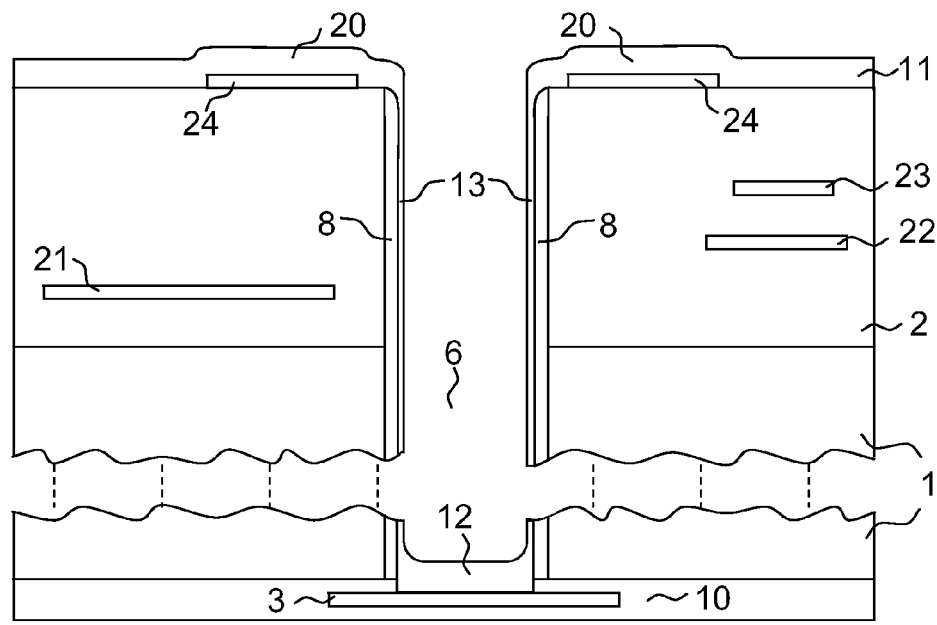
FIG. 6 shows a cross-section according to FIG. 5 after the application of a metallization.

FIG. 6 shows the cross-section as in FIG. 5 after application of a metallization 11. The metallization 11 is an electrically conductive material and can comprise tungsten in particular. It is advantageous if a thin Ti/TiN film, which can be provided as a contact layer and/or a diffusion barrier, is applied before application of the tungsten by means of CVD (chemical vapor deposition) for example. The connection contact 12 on the contact area 9 of the connection metal plane 3, a vertical through-contact 13 on the side wall of the contact hole 6, and the connection contacts 20 on the contact areas 19 of the uppermost metal plane 24 are formed with the metallization 11. The through contact 13 is electrically insulated from the semiconductor material of the substrate 1 by the spacer 8. The metallization 11 can then be structured as needed, into conductor traces for example, by means of an additional mask on the upper side of the component.

Figure 7:
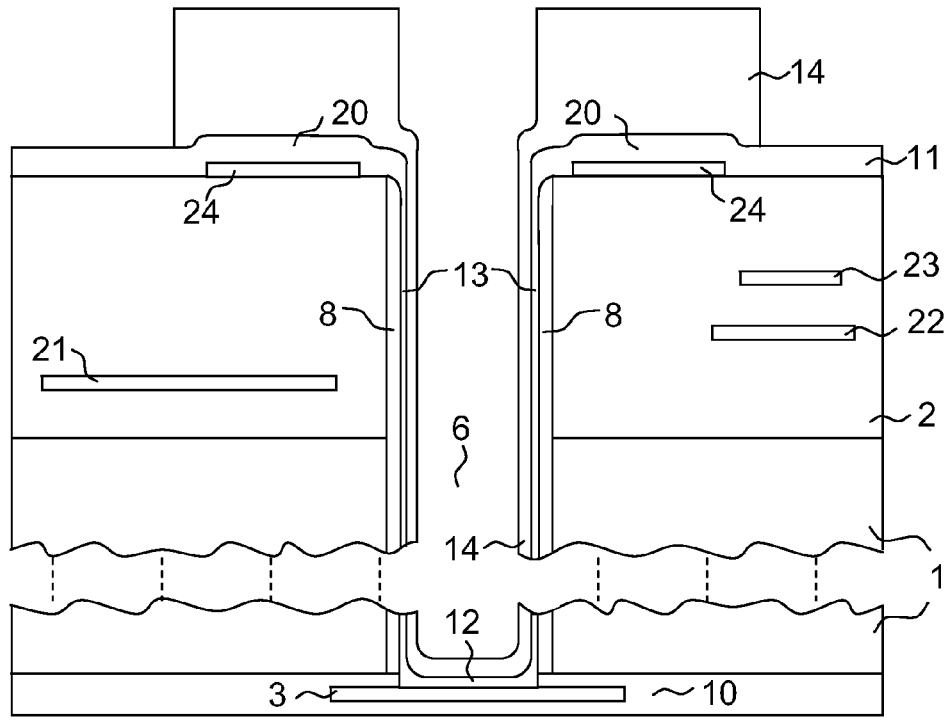
FIG. 7 shows a cross-section according to FIG. 6 after the application of another mask.

FIG. 7 shows a cross-section as in FIG. 6 after application of a mask 14, which can be produced by means of the spray coating method for example. This mask 14 can be optimized with the described method so that optimal edge coverage of the metallization 11 is achieved. The metallization 11 remains intact underneath the mask 14. The portions of the metallization not covered by the mask 14 can be removed in order to structure the metallization 11 on the upper side of the component in this manner.

Figure 8:
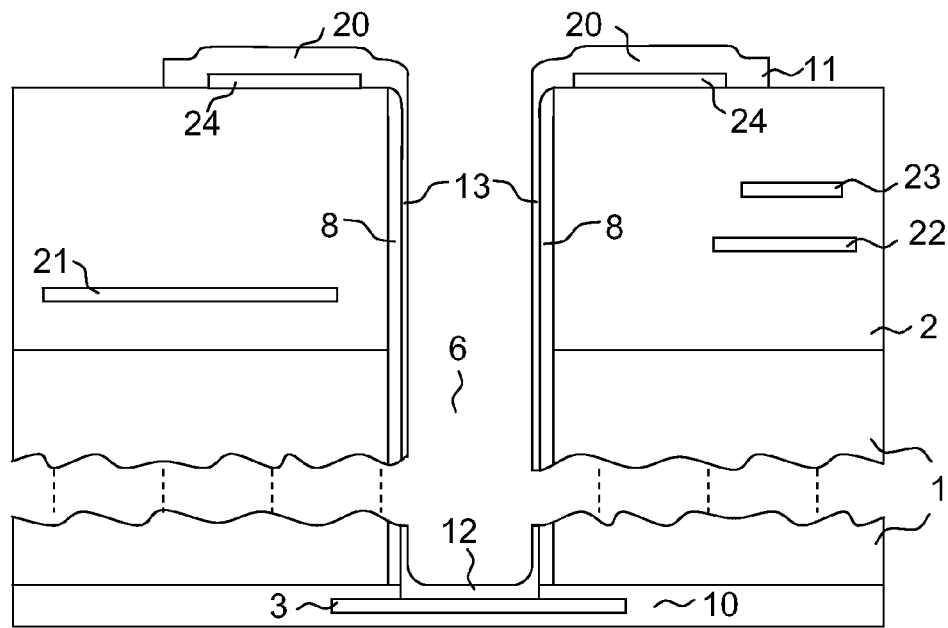
FIG. 8 shows a cross-section according FIG. 7 after structuring of the metallization and removal of the additional mask.

FIG. 8 shows the cross-section of FIG. 7 after structuring of the metallization 11 and removal of the mask 14. The process sequence described has the advantage, in particular, that all metal layers 21, 22, 23, 24, including the uppermost metal layer 24 (top metal), are already structured in the desired manner before the metallization 11 for the through-contact 13 is applied and structured. It is therefore not necessary to subsequently structure a top metal plane if the metallization of the through-contact has already been produced. Problems that arise in connection with elaborate mask technology are avoided in this manner. The spray coating process, the application of which is due to the relatively large-diameter contact hole, can be applied in a simpler manner in the described method, which is particularly advantageous in regard to additional components produced on the same substrate.

Figure 9:
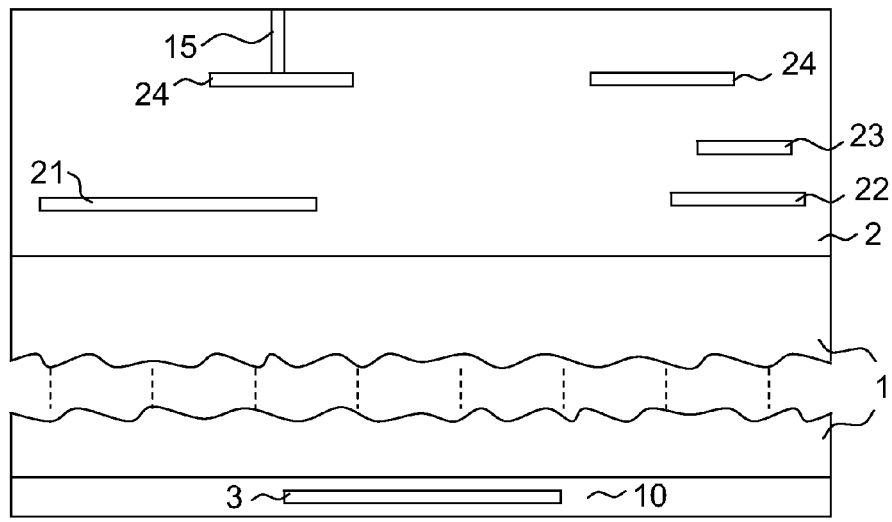
FIG. 9 shows a cross-section according to FIG. 1 for an embodiment of the method.

FIG. 9 shows a cross section as in FIG. 1 through an embodiment in which the uppermost metal plane 24 is not arranged on top of the inter-metal dielectric 2, but rather inside the inter-metal dielectric 2. At least one vertical conductive connection 15 that contacts a structured portion of one of the metal planes—the top metal plane 24 in the illustrated example—leads to the upper side of the component. The vertical conductive connection 15 is tungsten in preferred embodiments. The other components of this embodiment correspond to the components illustrated in FIG. 1 and are marked with the same reference numbers.

Figure 10:
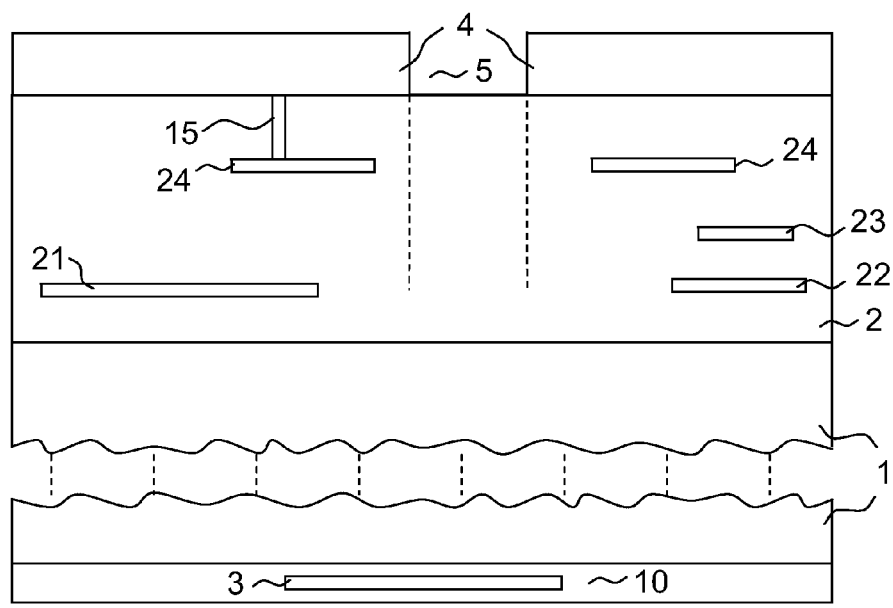
FIG. 10 shows a cross-section according to FIG. 9 after the application of a mask.

FIG. 10 shows a cross section as in FIG. 2 for the corresponding next method step, in which a mask 4 with an opening 5 is used to produce an opening in the inter-metal dielectric 2. The area of the opening to be produced is indicated in FIG. 10 with the vertical dashed lines.

Figure 11:
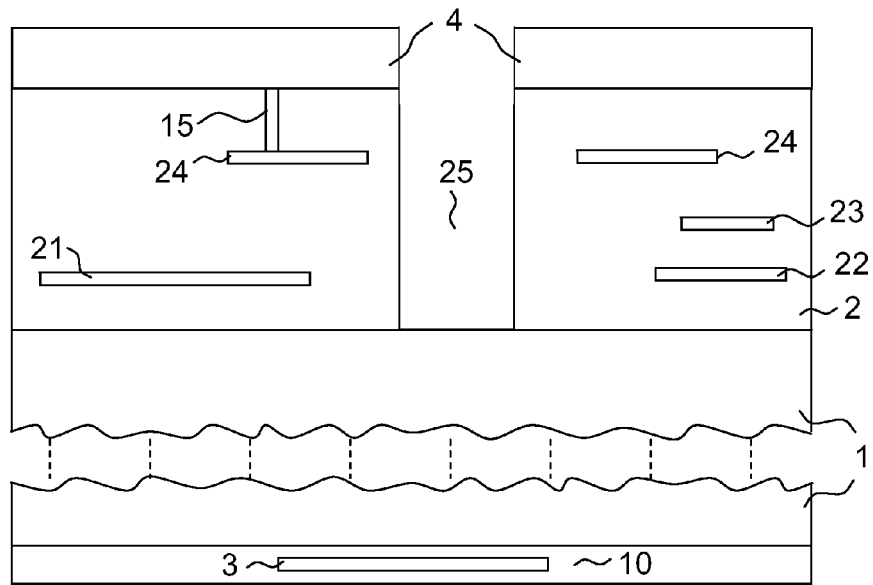
FIG. 11 shows a cross-section according to Figure after the production of an opening in the inter-metal dielectric.

FIG. 11 shows a cross section as in FIG. 10 for an intermediate product after the production of an opening 25 in the inter-metal dielectric 2. This method step ends when the semiconductor material of the substrate 1 is exposed. If the semiconductor material is silicon and the inter-metal dielectric 2 is silicon dioxide, the opening 25 is produced with a typical etching method with which silicon dioxide can be removed selectively relative to silicon.

Figure 12:
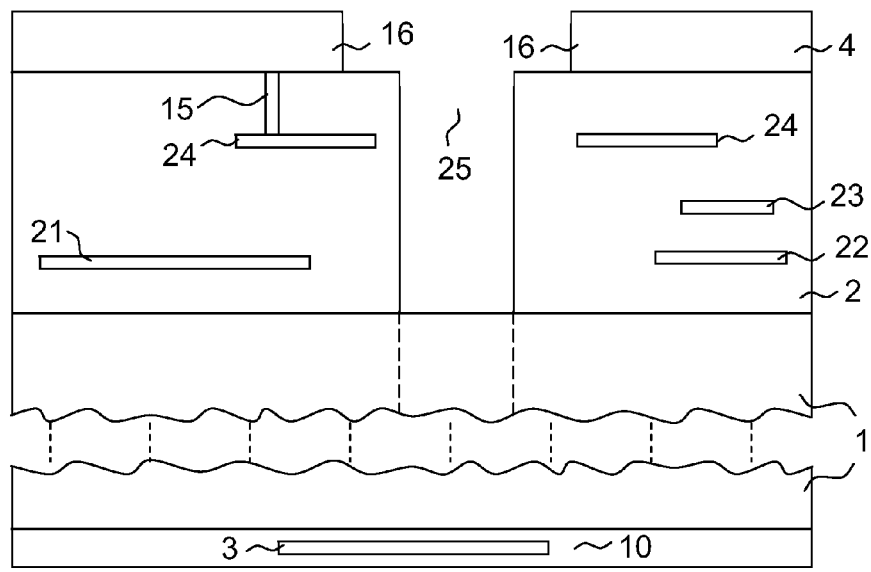
FIG. 12 shows a cross-section according to FIG. 11 after the production of an enlarged opening of the mask.

FIG. 12 shows a cross section as in FIG. 11 after the opening of the mask 4 has been enlarged or an additional mask 4 with a larger opening has been applied. The mask 4 therefore has a setback 16 at the edge of the opening 25, so that the inter-metal dielectric 2 is exposed at the edges of the opening 25 on the upper side as well. The inter-metal dielectric 2 is now used as a hard mask for etching the semiconductor material by means of DRIE for example.

Figure 13:
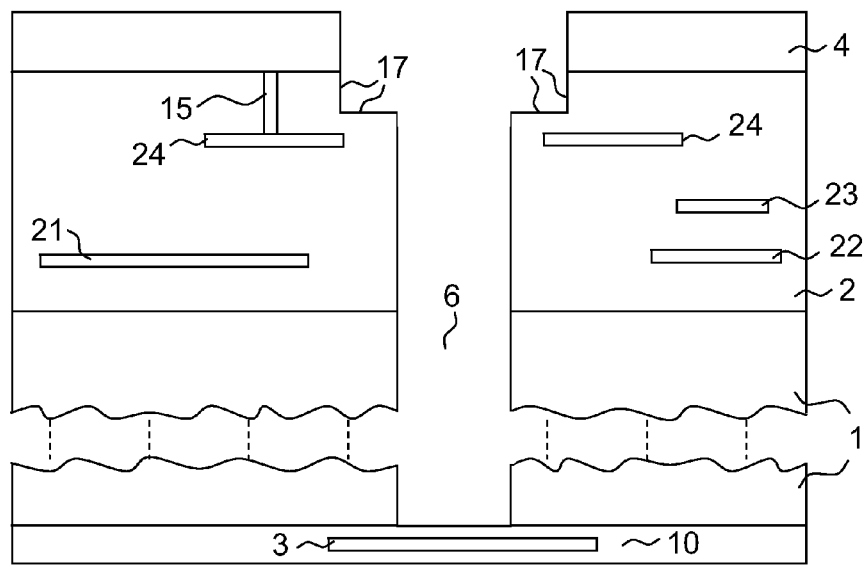
FIG. 13 shows a cross-section according to FIG. 12 after the production of the contact hole.

FIG. 13 shows a cross section as in FIG. 12 after production of the contact hole 6. Because the mask 4 does not completely cover the top side of the inter-metal dielectric 2, a portion of the inter-metal dielectric 2 at the edges of the contact hole 6 is also removed during etching of the contact hole 6 so that the step 17 shown in FIG. 13 arises. The step 17 can be formed in such a manner that the upper metal plane 24 remains completely covered by the inter-metal dielectric 2, as shown in FIG. 13. Instead of that, however, it is also possible to remove a sufficient amount of the inter-metal dielectric 2 that a contact area of the uppermost metal plane 24 facing away from substrate 1 is exposed. The first possibility will be described below with reference to FIGS. 14-16.

Figure 14:
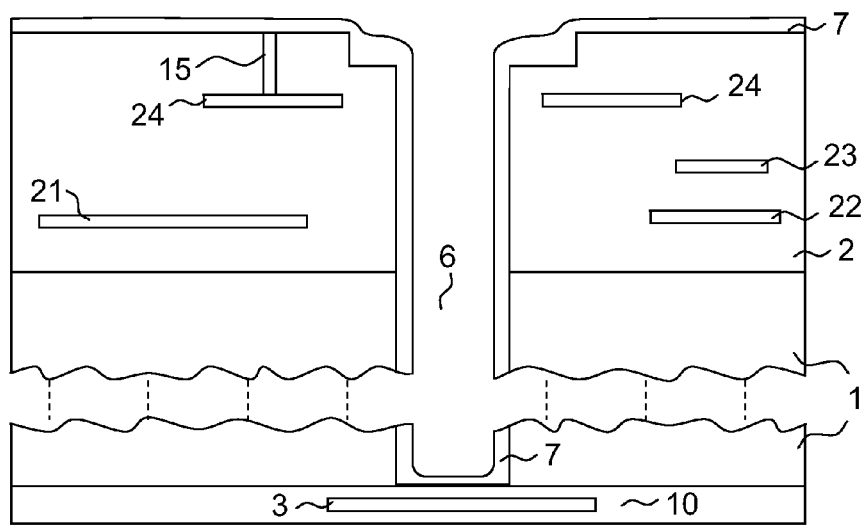
FIG. 14 shows a cross-section according to FIG. 13 after the application of a spacer material.

FIG. 14 shows a cross-section as in FIG. 13 after application of an electrically insulating material 7 intended for a spacer, and therefore corresponds to the cross-section of FIG. 4. In this embodiment as well, the electrically insulating material 7 is applied conformally, so that the edges, including the step 17, are covered.

Figure 15:
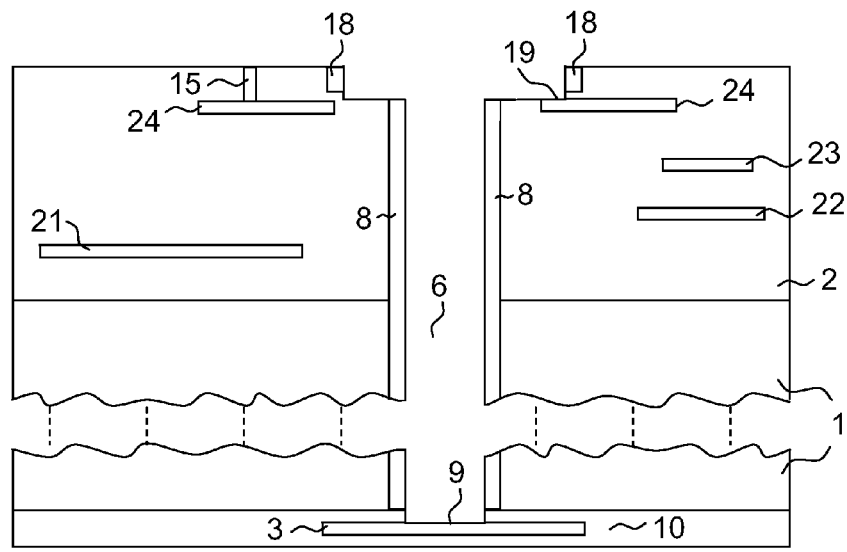
FIG. 15 shows a cross-section according to FIG. 14 after the spacer etching.

FIG. 15 shows a cross-section as in FIG. 14 after anisotropic etch-back of the electrically insulating material 7, of which a spacer 8 on the side wall of the contact hole 6 and an additional spacer 18 at the edge of the step 17 remain. During the etching-back of the electrically insulating material 7, the inter-metal dielectric 2 is removed to such an extent that the contact area 19 on the upper side of the uppermost metal plane 24 facing away from the substrate 1 is exposed in the area of the step 17. For this it is particularly expedient if the material of both the inter-metal dielectric 2 and the electrically insulating material 7 that is provided for the spacer 8 is silicon dioxide. In this variant of the method as well, the contact area 9 on the connection metal plane 3 is preferably exposed with the spacer etching. In the intermediate product illustrated in FIG. 15, the contact area 9 of the connection metal plane 3 and the contact area 19 of the uppermost metal plane 24 facing away from the substrate 1 are exposed, corresponding to the intermediate product in accordance with FIG. 5.

Figure 16:
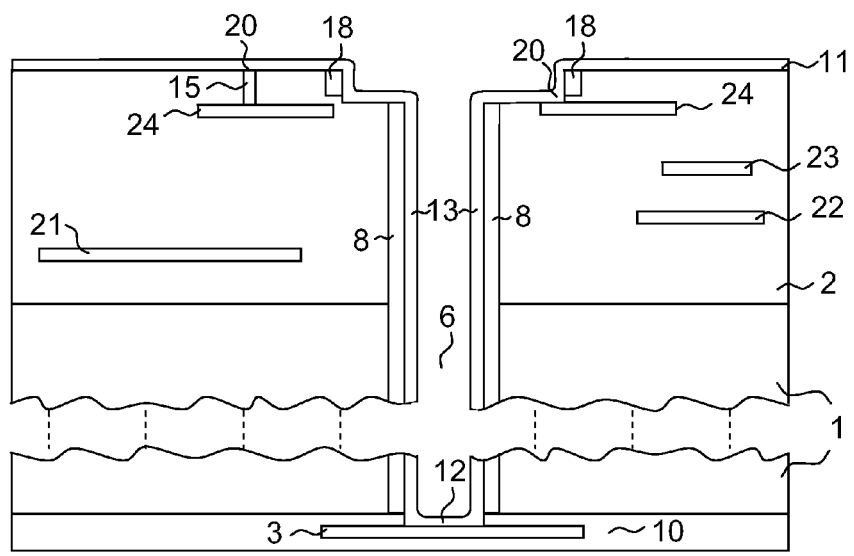
FIG. 16 shows a cross-section according to FIG. 15 after the application of the metallization.

FIG. 16 shows a cross-section as in FIG. 15 after application of the metallization 11, which can be formed substantially of tungsten in this example as well. As in the previously described embodiment, a base metallization of Ti/TiN can be provided. The metallization 11 forms a connection contact 12 on the contact area of the connection metal plane 3, the through-contact 13 and connection contacts 20 on the contact area 19 of the middle plane 24 and directly on the vertical conductive connection 15, i.e., without the provision of a connection contact layer or a contact pad between the metallization 11 and the vertical conductive connection 15. Connection contacts 20 on the contact area 19 or on vertical conductive connections 15 can be provided individually or jointly and in arbitrary number independently of one another. The connection contacts 12, 20 are connected to one another via the vertical through-contact 13. Another mask 14, with which the metallization 11 can be structured, can now be applied by the spray coating method.

Figure 17:
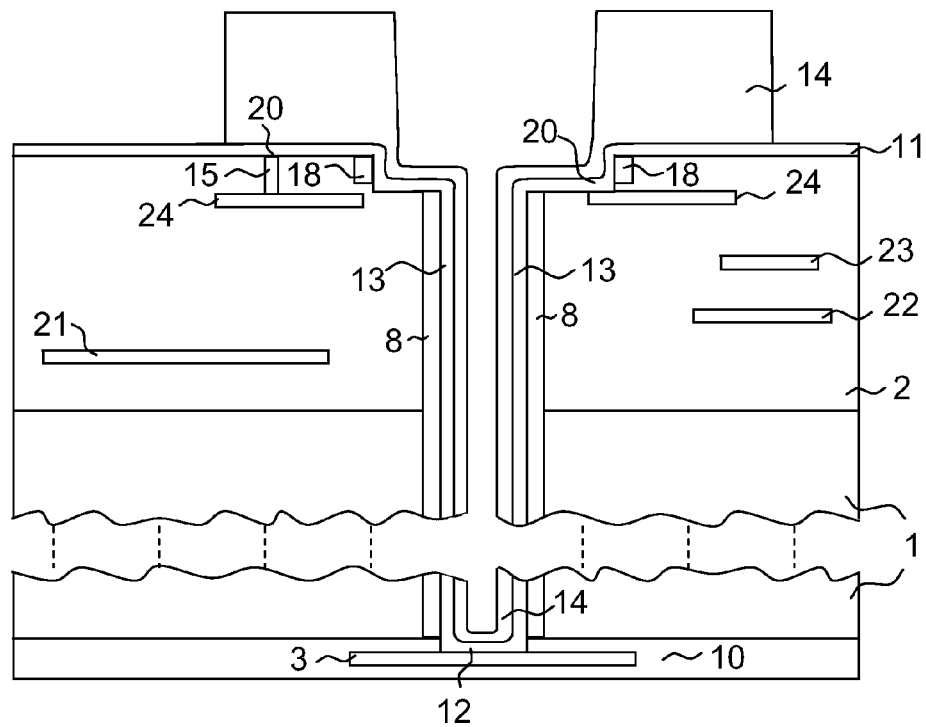
FIG. 17 shows a cross-section according to FIG. 16 after the application of another mask.

FIG. 17 shows a cross section as in FIG. 16 after production of the mask 14, which preferably covers the metallization 11 to such an extent that the entire portion of the metallization 11 present in the contact hole 6 remains intact during the subsequent structuring step. The portions of the metallization 11 not covered by the mask 14 can then be removed.

Figure 18:
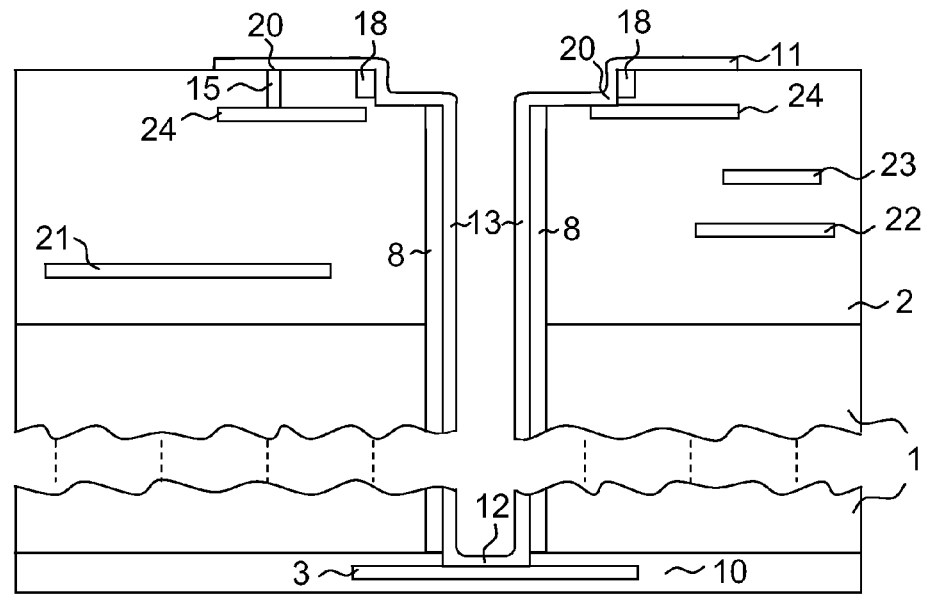
FIG. 18 shows a cross-section according FIG. 17 after structuring of the metallization and the removal of the mask.

FIG. 18 shows a cross-section as in FIG. 17 after structuring of the metallization 11 and after removal of the mask 14. The essential difference between FIGS. 8 and 18 is the design of the upper connection contacts 20, which connect the through-contact 13 to the upper metal plane 24. The illustrated connection contacts 20 can be provided independently of one another. For example, only one connection contact can be formed on a contact area or only one connection contact on a vertical conductive connection that leads through the inter-metal dielectric to the top surface. Instead of that, several of the two described types of connection contacts can be provided.

Figure 19:
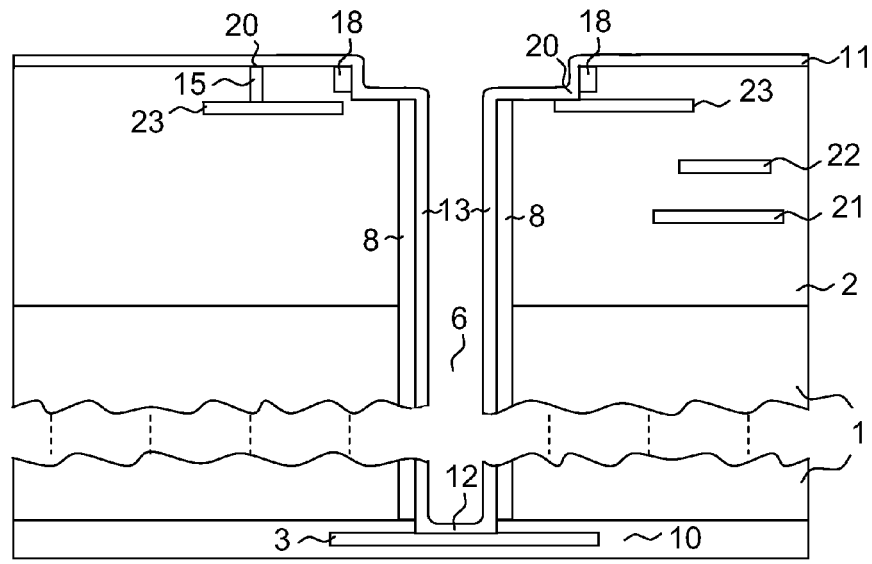
FIG. 19 shows a cross-section according to FIG. 16 for another embodiment.

FIG. 19 shows a cross section as in FIG. 16 for another embodiment, in which the uppermost metal plane 23 is the second to last, e.g. the third, metal plane that is provided for the integrated components on substrate 1. The metal planes 21, 22, 23 in FIG. 19, which can be structured as desired and can be connected to one another via vertical conductive connections, are each represented schematically by individual portions. A vertical conductive connection 15, which is preferably tungsten, is located in this embodiment on the upper metal plane 23. Several vertical conductive connections, which connect different portions of the metal planes 21, 22, 23 to one another, can be provided. The wiring formed with the metal planes 21, 22, 23 and vertical conductive connections can be constructed in different ways, independently of the production of the through-contact. The metallization 11 forms connection contacts 20 on a contact area of the metal plane 23 and directly on the vertical conductive connection 15. Connection contacts 20 on the contact area 19 or on vertical conductive connections 15 can also be provided in the embodiment according to FIG. 19 independently of one another, singly or jointly in an arbitrary number.

Figure 20:
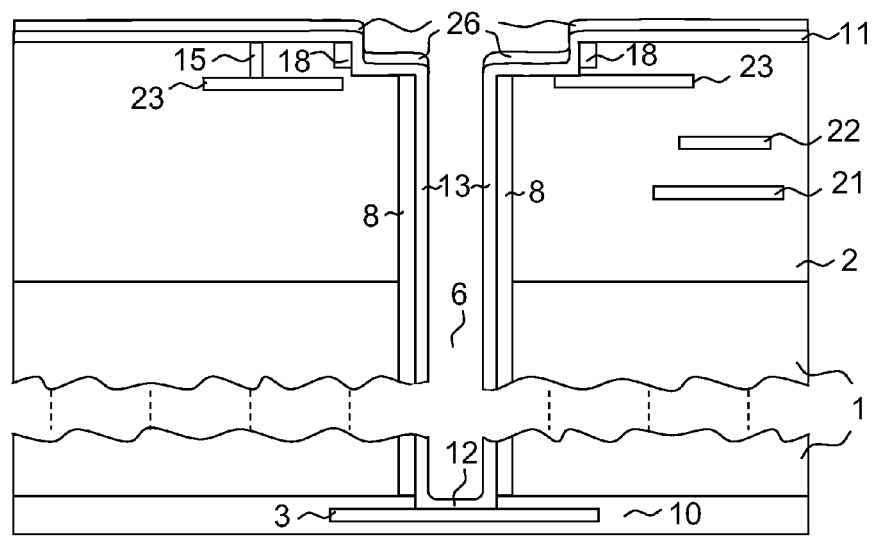
FIG. 20 shows a cross-section according to FIG. 19 after the application of another metal plane.

FIG. 20 shows a cross-section as in FIG. 19 after application of another metal plane 26. Portions of the additional metal plane 26 are now located on the horizontal surfaces of the metallization 11.

Figure 21:
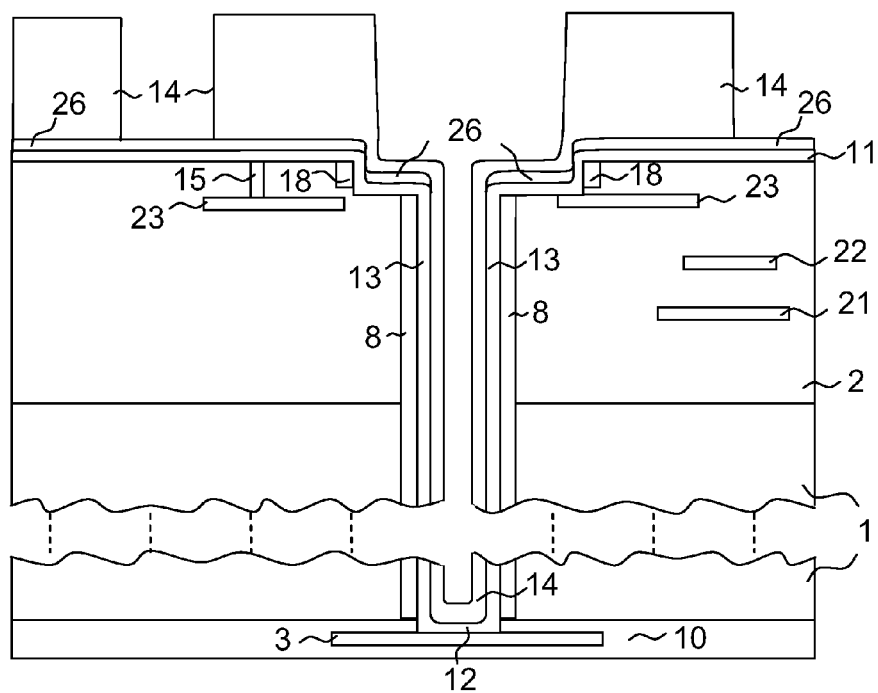
FIG. 21 shows a cross-section according to FIG. 20 after the application of another mask.

FIG. 21 shows a cross-section as in FIG. 20 after production of an additional mask 14, which covers areas of the metallization 11 and the additional metal plane 26 and in particular covers the portion of the metallization 11 present in the contact hole. The mask 14 is used for simultaneous and joint structuring of the metallization 11 and the additional metal plane 26.

Figure 22:
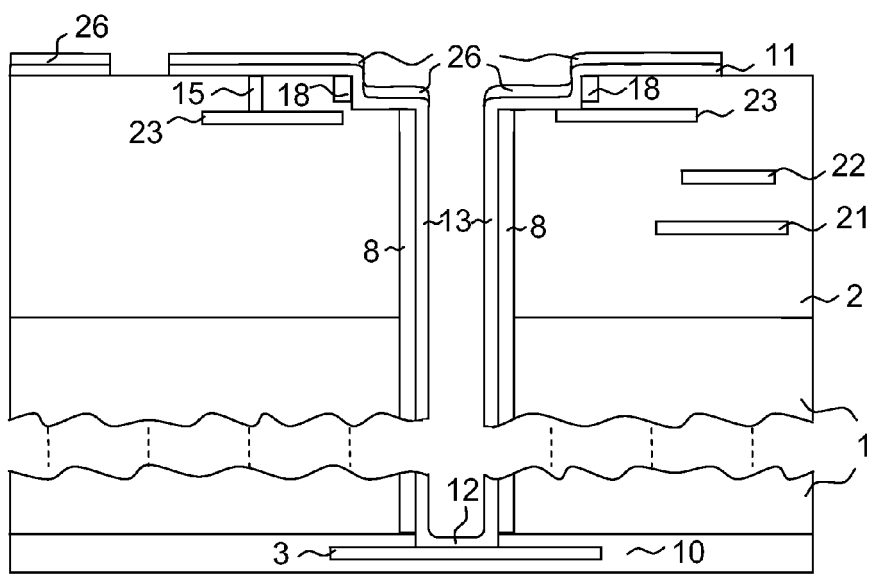
FIG. 22 shows a cross-section according FIG. 21 after a structuring of the metallization and the additional metal plane and after the removal of the mask.

FIG. 22 shows a cross-section as in FIG. 21 after the joint structuring of the metallization 11 and the additional metal plane 26 and after removal of the mask 14. The additional metal plane 26 reinforces the top-side portions of the metallization 11.

The method described with reference to embodiments simplifies the application of the spray coating method used because of the relatively large contact hole, with which problems occur if a metal plane is to be structured that was not applied until after production of the metallization applied for the through-contact. In the method described here, the connection contact for the top-side connection of the through-contact is produced on a metal plane that has already been structured before application of the metallization for the through-contact. The spray coating mask can therefore be formed more simply and the problems connected with the spray coating method are reduced, because only the comparatively rough top-side structuring of the metallization provided for the through-contact is done by spray coating.

LIST OF REFERENCE NUMBERS

1 Substrate
2 Inter-metal dielectric
3 Connection metal plane
4 Mask
5 Opening
6 Contact hole
7 Electrically insulating material
8 Spacer
9 Contact area
10 Base substrate
11 Metallization
12 Connection contact
13 Through-contact
14 Mask
15 Vertical conductive connection
16 Setback
17 Step
18 Additional spacer
19 Contact area
20 Connection contact
21 Metal plane
22 Metal plane
23 Metal plane
24 Metal plane
25 Opening
26 Additional metal plane

We claim:

1. A method of producing a semiconductor component with a through-contact, comprising:
  providing a substrate of a semiconductor material with an intermetal dielectric and with a metal plane, which is arranged in the intermetal dielectric and comprises a contact area facing away from the substrate;
  connecting a base substrate provided with a connection metal plane, which has a contact area and is surrounded by an electrically insulating material, to the substrate on the side of the substrate facing away from the intermetal dielectric, so that the contact area faces the substrate; and
  forming a contact hole through the intermetal dielectric and the semiconductor material of the substrate, and the contact area of the connection metal plane is exposed in the contact hole,
  wherein before the production of the contact hole, an opening in the intermetal dielectric is produced by means of a mask provided with an opening in an area of the contact hole,
  wherein the opening of the mask is enlarged or the mask is replaced by a further mask with a larger opening, so that the contact area facing away from the substrate is located in an area of the larger opening of the mask,
  wherein the contact hole is produced using the intermetal dielectric as a hard mask, the intermetal dielectric being removed in the area of the larger opening of the mask above the contact area facing away from the substrate, and
  wherein a metallization is applied, which forms a connection contact on the contact area facing the substrate, a through-contact in the contact hole, and a connection contact on the contact area facing away from the substrate.

2. The method according to claim 1, wherein before the application of the metallization, a spacer made from electrically insulating material is produced in the contact hole, so that the metallization is electrically insulated from the semiconductor material by the spacer.

3. The method according to claim 2, wherein the spacer is produced by conformally applying the electrically insulating material and then anisotropically etching it back, and likewise etching back the intermetal dielectric, so that the contact area facing away from the substrate is exposed.

4. The method according to claim 1, wherein tungsten is used for the metallization, and a further metal plane made from a different metal is applied on the metallization and is structured together with the metallization.

* * * * *